United States Patent [19]
Hyun et al.

[11] Patent Number: 5,655,047
[45] Date of Patent: Aug. 5, 1997

[54] VIDEO SIGNAL FREQUENCY MODULATOR HAVING AUTOMATIC CONTROL FUNCTION AND CONTROLLING METHOD THEREFOR

[75] Inventors: Yun-jong Hyun; Jong-ho Ahn, both of Incheon, Rep. of Korea

[73] Assignee: Samsung Electronics Co., Ltd., Suwon, Rep. of Korea

[21] Appl. No.: 715,361

[22] Filed: Sep. 12, 1996

Related U.S. Application Data

[63] Continuation of Ser. No. 213,012, Mar. 14, 1994, abandoned.

[30] Foreign Application Priority Data

Mar. 12, 1993 [KR] Rep. of Korea .................. 93-3754

[51] Int. Cl.$^6$ .................. H04N 5/91; H04N 9/80; H04N 5/52; H04N 5/50
[52] U.S. Cl. .................. 386/10; 386/26; 386/93; 348/678; 348/735; 360/30
[58] Field of Search .................. 386/26, 41, 9, 386/10, 46, 93; 360/29, 30; 348/678, 690, 735, 725; 332/117, 123, 125, 126, 127, 128; H04N 9/68, 9/793, 5/92, 5/76, 5/91, 5/52, 5/50

[56] References Cited

U.S. PATENT DOCUMENTS 4,703,340  10/1987  Balaban et al. .................. 348/505
4,918,529   4/1990  Douziech et al. .................. 348/678
5,355,226  10/1994  Nogami et al. .................. 386/113

*Primary Examiner*—Thai Tran
*Attorney, Agent, or Firm*—Cushman Darby & Cushman, IP Group of Pillsbury Madison & Sutro LLP

[57] ABSTRACT

A video signal frequency modulator having an automatic control function includes a reference generator for generating a sync tip level signal and a white peak level signal, a first switch for selecting one of the sync tip level signal, white peak level signal or a clamped video signal according to a mode control signal, a variable gain amplifier for amplifying the output of the first switch to a predetermined gain and converting the amplified result into a current, an adder for adding the output of the variable gain amplifier with a predetermined set value, an oscillator for frequency-modulating the output of the adder, a frequency detector for shaping and frequency-dividing the output of the oscillator, a microcomputer for comparing the output of the frequency detector with a predetermined reference frequency and outputting first and second control data and the mode control signal, a carrier frequency setting portion for controlling the magnitude of the predetermined set value according to the first control data, and a frequency deviation setting portion for controlling the predetermined gain according to the second control data.

15 Claims, 6 Drawing Sheets

VIDEO SIGNAL FREQUENCY MODULATOR HAVING AUTOMATIC CONTROL FUNCTION AND CONTROLLING METHOD THEREFOR

This is a continuation of application Ser. No. 08/213,012, filed on Mar. 14, 1994, which was abandoned upon the filing hereof.

BACKGROUND OF THE INVENTION

The present invention is generally directed to a signal frequency modulator and its method of control. More particularly, the present invention is directed to a video signal frequency modulator and a method for its control the in which carrier and deviation frequencies are automatically controlled.

In general, a video cassette recorder separates a video signal into luminance and chrominance signals, and modulates them. The luminance signal is modulated to a frequency determined by the recording format, such as VHS or 8 mm. For instance, if an NTSC video signal is to be recorded in a VHS format, the luminance signal is modulated to a frequency of 4.4 MHz at white peak level and to frequency of 3.4 MHz at sync tip (i.e., blanking) level, thereby having 1 MHz of frequency deviation.

FIG. 1 is a circuit diagram of a conventional video signal frequency modulator. The conventional video luminance signal frequency modulator is equipped with clamping circuit 91, buffer 92, V/I (voltage to current) converter 93, and oscillator 94, frequency-modulating the video signal. Clamping circuit 91 receives the video luminance signal from an AGC amplifier (not shown) and clamps the signal at the sync tip level. Buffer 92 sends the output of clamping circuit 91 to V/I converter 93. V/I converter 93 transforms the voltage change of the video signal into a current change. Oscillator 94 receives and frequency-modulates the output of V/I converter 93. Oscillator 94 may be easily implemented in the form of a monostable multivibrator. V/I converter 93 is composed of variable resistors VR1 and VR2, PNP transistor Q1 and bias-voltage supply source $V_{REF}$.

Video luminance signal Y is fed to V/I converter 93 via clamping circuit 91 and buffer 92. The voltage change of the video luminance signal, input to the emitter of transistor Q1 via variable resistor VR2 of V/I converter 93, is converted into a change of collector current $I_{in}$ of transistor Q1, and is output to oscillator 94. Bias-voltage supply source VREF is connected to the base of transistor Q1. Oscillator 94 frequency-modulates the magnitude of input current $I_{in}$. The variable resistors VR1 and VR2 are controlled to adjust $I_{in}$ so that the modulated output of oscillator 94 will be suitable for the desired recording format. The carrier frequency is set by controlling variable resistor VR1 while observing the waveform of the frequency-modulated output FM VIDEO, and the frequency deviation is set by controlling variable resistor VR2. This controlling process is typically performed manually during the assembly of VCRs, cam corders, and other devices employing a frequency modulator. This is an obstacle to the automation of the assembly process. Further, the manual nature of the controlling operation makes it difficult to uniformly maintain the quality of products. To overcome such problems, the invention described U.S. Pat. No. 4,918,529 was proposed. In the disclosed device, a white peak level signal and sync tip signal are received from an insertion circuit according to control signals and are frequency-modulated, and the frequency-modulated signal is compared with a reference signal so as to automatically control the gain of a variable amplifier and the output of an adder. Despite the advantage of automatically controlling the video signal frequency modulator, the disclosed device requires additional analog circuits for a frequency generator and discriminator.

SUMMARY OF THE INVENTION

Therefore, it is an object of the present invention to provide a video signal frequency modulator having an automatic control function which uses a microcomputer.

It is another object of the present invention to provide an automatic controlling method for a frequency modulator for automatically controlling the carrier frequency and frequency deviation in accordance with a desired recording format.

To accomplish the first object, there is provided a video signal frequency modulator which operates under a first control mode for controlling the carrier frequency with a sync tip level signal, under a second control mode for controlling the frequency deviation with a white peak level signal, and under a normal mode for frequency modulation of a video luminance signal. The modulator is provided with an automatic control function and operates as follows. A reference signal generator generates a sync tip level signal and a white peak signal. A first switch selects one of the sync tip level signal, white peak level signal, or video luminance signal according to a mode control signal. A variable gain amplifier amplifies the output of the first switch by a predetermined gain and converts the amplified result into an output current. An adder adds the output current of the variable gain amplifier to a predetermined set value. An oscillator frequency-modulates the output of the adder. A frequency detector shapes and frequency-divides the output of the oscillator; a microcomputer then compares the output of the frequency detector with a predetermined reference frequency and outputs first and second control data and the mode control signal. A carrier frequency setting portion controls the magnitude of the predetermined set value according the first control data, and a frequency deviation setting portion controls the predetermined gain according to the second control data.

As another embodiment of the present invention, there is provided a frequency modulator which automatically sets the carrier frequency and frequency deviation according to the control of a microcomputer and which frequency-modulates a clamped video signal. The modulator operates generally as follows. A reference signal generator generates a sync tip signal and a white peak signal. Then a first switch selects one of the sync tip signal, white peak signal or a clamped video signal according to a mode control signal. A variable gain amplifier amplifies the output of the first switch by a predetermined gain and converts the amplified result into current. An adder then adds the output of the variable gain amplifier to a predetermined set value, and an oscillator frequency-modulates the output of the adder. A Schmitt trigger circuit is provided for shaping the frequency modulated output, and a divider frequency-divides the output of the Schmitt trigger circuit. A bus decoder interfaces with the microcomputer and outputs a first control data, a second control data and the mode control signal. A first digital-to-analog converter converts the first control data into a first analog signal, and a second digital-to-analog converter converts the second control data into a second analog signal. A V/I converter converts the second analog signal of the second digital-to-analog converter into a current.

To accomplish the second object of the present invention, there is provided an automatic controlling method for a video signal frequency modulator. According to the method, in a first control step, a carrier frequency is controlled in accordance with a sync tip signal. In a second control step, the frequency deviation is controlled in accordance with a white peak signal. According to a normal step, a clamped video signal is frequency modulated. In the first control step, the sync tip signal is received and the output of an adder is set according to a first control data so that the carrier frequency of the modulated output coincides with a carrier reference frequency. In the second control step, the white peak signal is received and the gain of a variable gain amplifier is set according to a second control data so that the frequency deviation of the modulated output coincides with a deviation reference frequency. In the normal step, the clamped video signal is received for frequency modulation after the first and second control steps.

BRIEF DESCRIPTION OF THE INVENTION

The above objects and advantages of the present invention will become more apparent by describing in detail a preferred embodiment thereof with reference to the attached drawings in which.

DETAILED DESCRIPTION OF THE INVENTION

Figure 1:
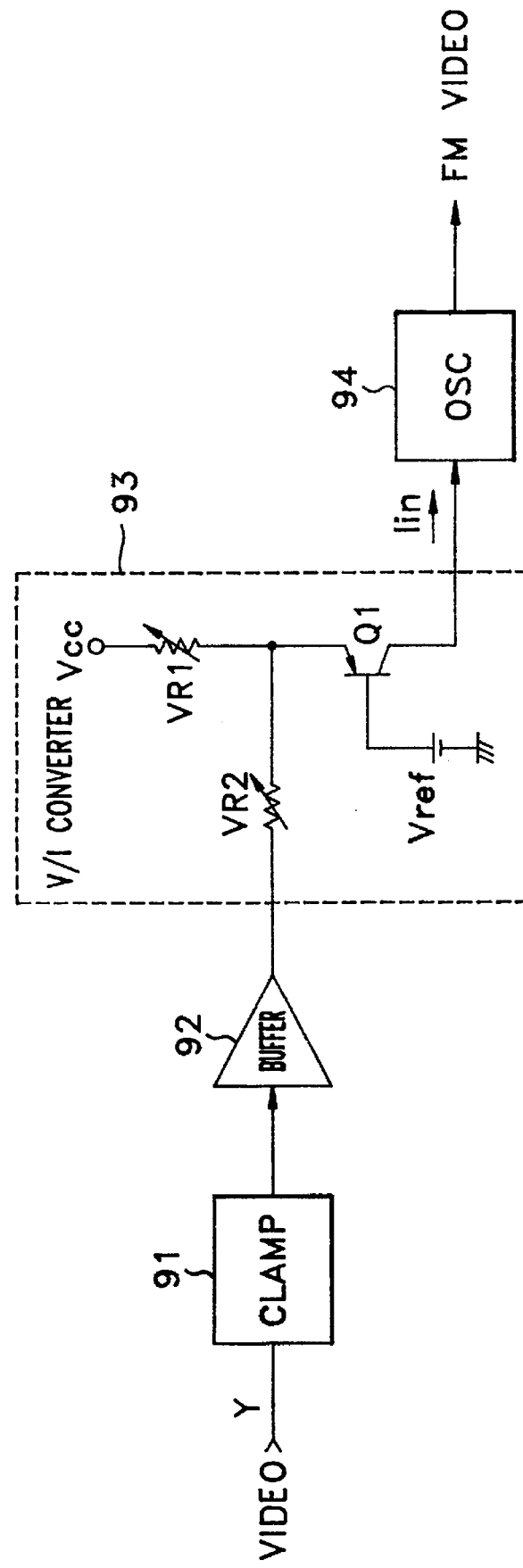
FIG. 1 is a circuit diagram of a conventional video signal frequency modulator.
Figure 2:
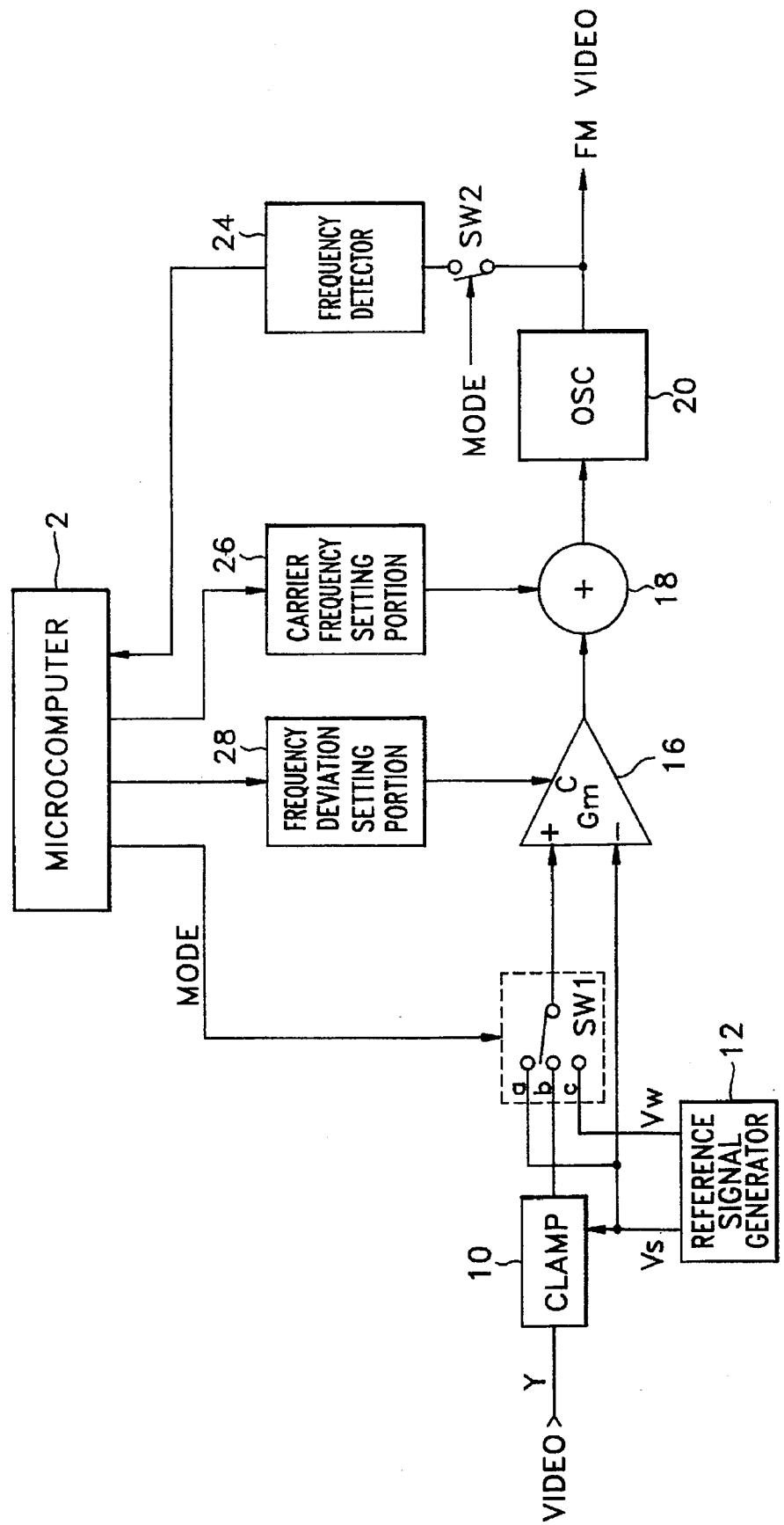
FIG. 2 is a block diagram of a video signal frequency modulator having an automatic controlling function according to the present invention.

FIG. 2 is a block diagram of a video signal frequency modulator having an automatic controlling function according to the present invention. As shown in FIG. 2, the frequency modulator of the present invention includes microcomputer 2, clamping circuit 10, reference generator 12, first switch SW1, variable gain amplifier 16, a adder 18, a oscillator 20, a second switch SW2, frequency detector 24, carrier frequency setting portion 26, and frequency deviation setting portion 28. The frequency modulator of the present invention operates to automatically control the carrier frequency and frequency deviation and to frequency-modulate a video signal.

In operation, generator 12 generates sync tip level signal $V_s$ for setting a carrier frequency and white peak level signal $V_w$ for setting a frequency deviation. Clamping circuit 10 receives video luminance signal Y and clamps it to the sync tip level. First switch SW1 receives sync tip level signal $V_s$ via fixed port a, clamped video luminance signal Y via fixed port b, and white peak level signal $V_w$ via fixed port c. The first switch selects one of these signals according to mode control signal MODE, and outputs the selected signal to variable gain amplifier 16. Variable gain amplifier 16 receives the output of first switch SW1 via a first input and receives sync tip level signal $V_s$ from reference generator 12 via a second input, amplifies the inputs by a predetermined gain set according to the output of frequency deviation setting portion 28, and converts the amplified voltage signal into a current signal. Adder 18 adds the output of variable gain amplifier 16 and the output of carrier frequency setting portion 26 so as to feed the added result to oscillator 20.

Oscillator 20 frequency-modulates the output of adder 18. When sync tip level signal $V_s$ is input, carrier frequency setting portion 26 sets the control input of adder 18 so that the frequency of the frequency-modulated output coincides with the carrier reference frequency. When white peak level signal $V_w$ is input, frequency deviation setting portion 28 sets the gain of variable gain amplifier 16 so that the frequency of the frequency-modulated output coincides with the deviation reference frequency. Microcomputer 2 receives the output of frequency detector 24 and compares it with predetermined reference frequencies (deviation reference frequency and carrier reference frequency) so as to output first control data for setting the carrier frequency, second control data for setting the frequency deviation, and mode control signal MODE.

Frequency detector 24 may be formed with a Schmitt trigger circuit for waveform-shaping the modulated output of oscillator 20, and a divider for frequency-dividing the output of the Schmitt trigger circuit. Carrier frequency setting portion 26 may be composed of a bus decoder for transmitting the first control data, a digital-to-analog converter for converting the output of the bus decoder into an analog voltage, and a V/I converter for converting the output of the digital-to-analog converter into a current. Frequency deviation setting portion 28 may have a bus decoder for transmitting the second control data and a digital-to-analog converter for converting the output of the decoder into an analog voltage.

The operation of the frequency modulator is divided into a control mode for controlling the frequency of the modulated output to coincide with a desired recording format (e.g., VHS or 8 mm), and a normal mode for receiving the video signal after the control mode is completed so as to carry out frequency modulation. The control mode can be subdivided into a first control mode for controlling the carrier frequency after receiving sync tip level signal $V_s$, and a second control mode for controlling the frequency deviation after receiving white peak level signal $V_w$.

In the first control mode, microcomputer 2 controls first switch SW1 so as to select sync tip level signal $V_s$, and turns on (i.e., closes) second switch SW2. Sync tip level signal $V_s$ is frequency-modulated by oscillator 20 via variable gain amplifier 16 and adder 18. The frequency-modulated output is divided by a predetermined number (divisor) by frequency detector 24, and is output to microcomputer 2.

Microcomputer 2 compares the output of frequency detector 24 with an internally set carrier reference frequency, and outputs the first control data to carrier frequency setting portion 26 to make the frequency of the modulated output coincide with the reference frequency. Carrier frequency setting portion 26 receives and stores the output of microcomputer 2, and converts the digital first control data to an analog control signal which is then output to adder 18. Adder 18 is set with the output value of carrier frequency setting portion 26, and adds the output of variable gain amplifier 16 with the set value. By repeating the process, the first control mode sets the output value of carrier frequency setting portion 26 so that sync tip level signal $V_s$ is modulated to the carrier reference frequency.

In the second control mode, microcomputer 2 controls first switch SW1 so as to select white peak level signal $V_w$, and turns on (i.e., closes) second switch SW2. White peak level signal $V_w$ is frequency-modulated by oscillator 20 via variable gain amplifier 16 and adder 18. The frequency-modulated output is frequency-divided by a predetermined number (divisor) by frequency detector 24, and is output to microcomputer 2. Microcomputer 2 compares the output of frequency detector 24 with the internally set deviation reference frequency, and outputs the second control data to deviation frequency setting portion 28 for making the frequency of the modulated output coincide with the deviation reference frequency. Frequency deviation setting portion 28 receives the output of microcomputer 2, and converts the digital second control data into an analog control signal so as to output the converted signal to variable gain amplifier 16. Variable gain amplifier 16 amplifies the input signal to a gain set according to the output of frequency deviation setting portion 28. By repeating the process, the second control mode sets the output value of frequency deviation setting portion 28 so that, if white peak level signal $V_w$ is input, it is modulated to the deviation reference frequency.

In the normal mode, microcomputer 2 controls first switch SW1 so as to select the output of clamping circuit 10, and turns off (i.e., opens) second switch SW2. Therefore, in the normal mode, the frequency modulator of the present invention frequency-modulates the input video signal and outputs a frequency-modulated video signal according to the values set in the first and second control modes.

Figure 3:
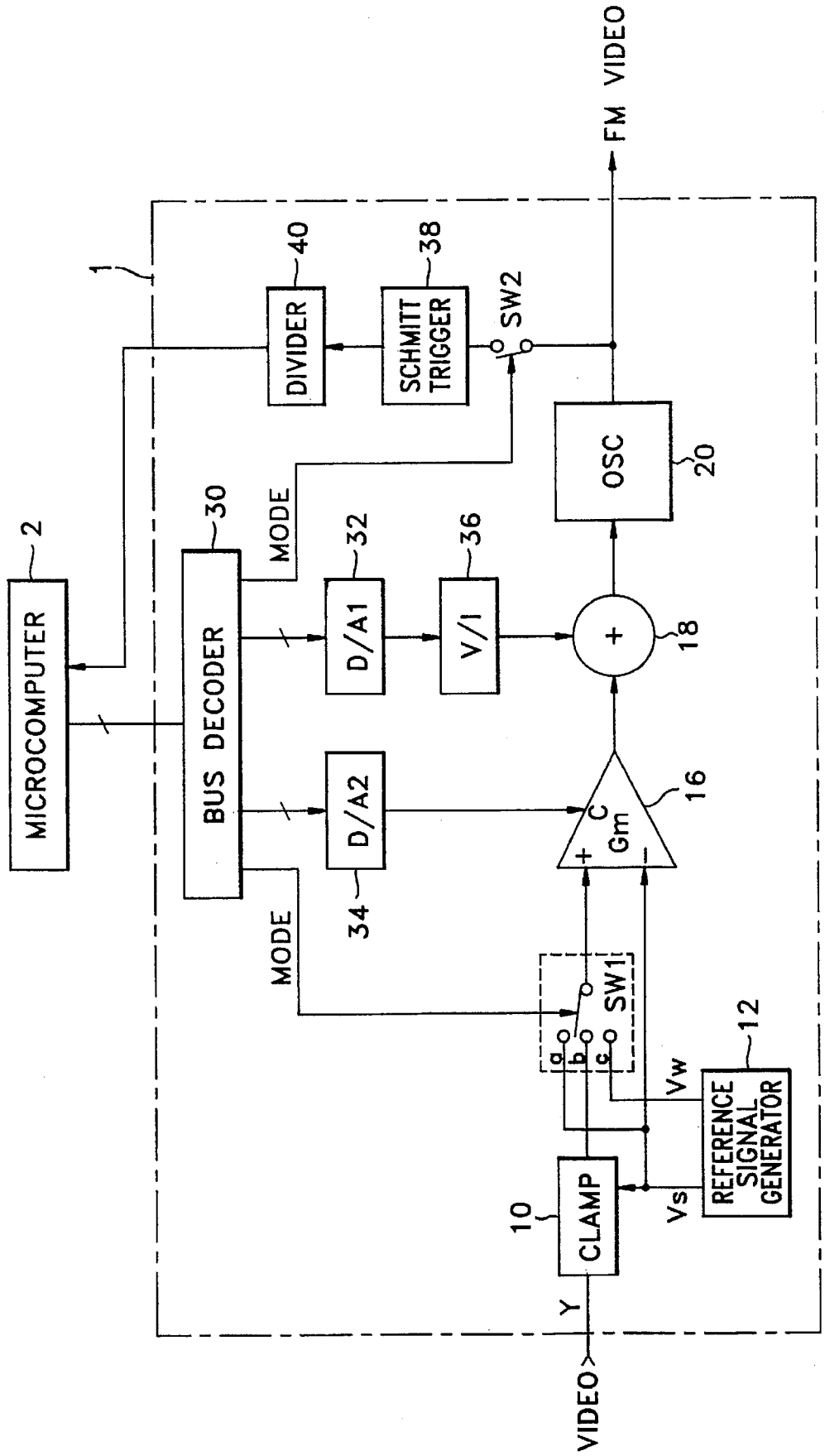
FIG. 3 is a detailed block diagram of one embodiment of the video signal frequency modulator having an automatic controlling function according to the present invention.

As shown FIG. 3, the frequency modulator of the present invention may also be constituted of microcomputer 2 and frequency modulating integrated circuit (IC) 1. Frequency-modulating IC 1 contains clamping circuit 10, reference generator 12, first switch SW1, second switch SW2, variable gain amplifier 16, adder 18, oscillator 20, bus decoder 30, first digital-to-analog converter 32, second digital-to-analog converter 34, V/I converter 36, Schmitt trigger circuit 38, or a divider 40.

Clamping circuit 10 clamps input video signal Y to the sync tip level (also called a clamp level) provided by reference generator 12, and outputs the signal to port b of first switch SW1. Reference generator 12 also generates sync tip level signal $V_s$ and outputs it to port a of first switch SW1 and to the inverted input of variable gain amplifier 16. Reference signal generator 12 also generates white peak level signal $V_w$ and outputs it to port c of first switch SW1.

According to mode control signal MODE input from bus decoder 30, first switch SW1 connects the non-inverting input of variable gain amplifier 16 to one of ports a, b and c of first switch SW1. Specifically, in the first control mode, first switch SW1 switches to port a so as to send sync tip level signal $V_s$ to variable gain amplifier 16. In the second control mode, the first switch connects to port c so as to send white peak level signal $V_w$ to variable gain amplifier 16. In the normal mode, the first switch switches to port b so that the clamped video signal is input to variable gain amplifier 16.

Variable gain amplifier 16 receives the output of first switch SW1 via one of its inputs and sync tip level signal $V_s$ from reference generator 12 via its other input, so as to amplify the inputs by a gain set according to the output of second digital-to-analog converter 34 and to convert the amplified voltage signal to a current signal. Adder 18 adds the outputs of variable gain amplifier 16 and of V/I converter 36, and outputs the added result to oscillator 20. Oscillator 20 frequency-modulates the output of adder 18 and outputs a frequency-modulated video signal.

Second switch SW2 receives mode control signal MODE and is turned on (closed) only during the control modes, so as to feed the modulated output of oscillator 20 to Schmitt trigger circuit 38. Second switch SW2 is turned off (open) during the normal mode. Schmitt trigger circuit 38 shapes the waveform of the input signal to a square wave, and outputs the signal to divider 40. Divider 40 frequency-divides the input signal, and sends the divided signal to microcomputer 2. The division level is appropriately determined according to the carrier frequency and frequency deviation.

Microcomputer 2 receives the output of divider 40 and compares it with a predetermined frequency, so as to output first control data for setting the carrier frequency and second control data for setting the frequency deviation. More specifically, in the first control mode, the microcomputer receives the carrier frequency from divider 40 and compares the frequency with the internally set carrier reference frequency so as to output the first control data. In the second control mode, the microcomputer receives the frequency deviation and compares it with the internally set deviation reference frequency so as to output the second control data. According to the operation mode, the microcomputer outputs mode control signal MODE so as to control first switch SW1 and second switch SW2.

Figure 5:
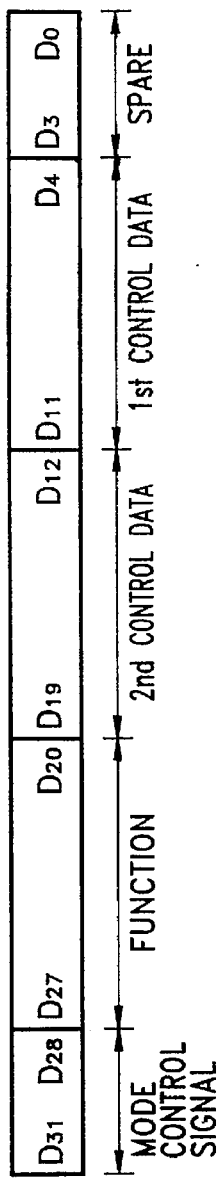
FIG. 5 illustrates the structure of the control data of the bus decoder shown in FIG. 3.
Figure 6:
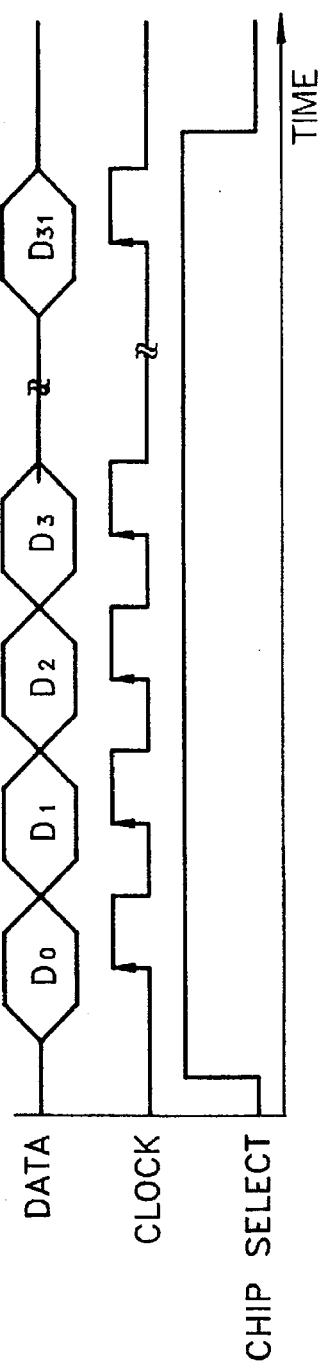
FIG. 6 is a timing diagram of the data latch of the bus decoder shown in FIG. 3.

Bus decoder 30 receives the control data from microcomputer 2 according to the timing illustrated in FIG. 6 and stores the data, for example, in a 32-bit internal register. The first control data is output to first digital-to-analog converter 32, and the second control data is output to second digital-to-analog converter 34. Mode control signal MODE is output to first and second switches SW1 and SW2, respectively. The register of bus decoder 30 is loaded with the data shown in FIG. 5.

First digital-to-analog converter 32 converts the first control data into an analog voltage signal which is then converted into a current signal by V/I converter 36. Second digital-to-analog converter 34 receives the second control data and converts the data into an analog signal.

The first and second control data are varied for automatic control during the control modes. After the control modes are completed, microcomputer 2 internally stores the first and second control data, which is latched to bus decoder 30 and to first and second digital-to-analog converters 32 and 34 so as to uniformly output them until the next control mode operation. For automatic control, the IC of the present invention reciprocates data with the external microcomputer 2. Here, the data sent from IC 1 to microcomputer 2 is read out by a timer of microcomputer 2. The data sent from microcomputer 2 to IC 1 is in serial data form, and the microcomputer and IC are connected with a data line, clock line and chip select line. Such interfaces may be selected according to the software of microcomputer 2 and the configuration of bus decoder 30.

Figure 4:
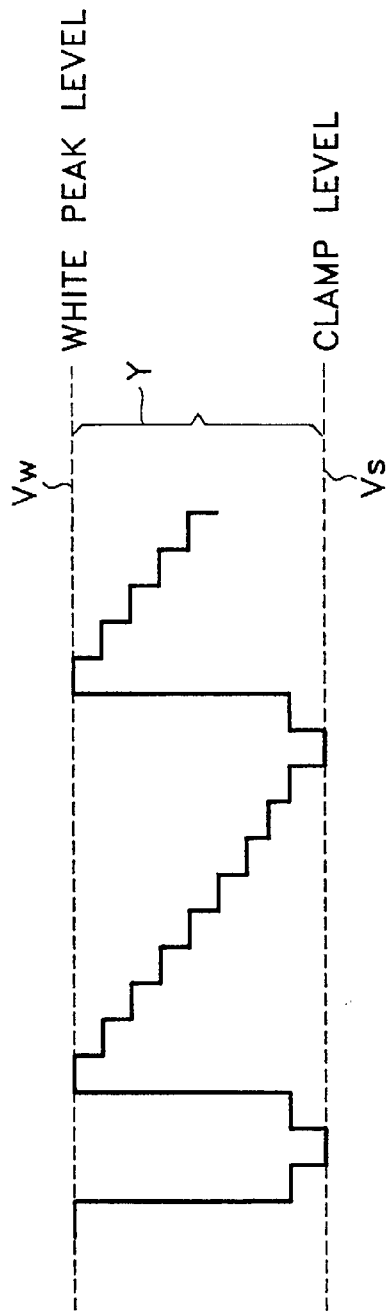
FIG. 4 is a waveform diagram of a video signal according to the present invention.

FIG. 4 shows a wave form of a video signal. In the normal mode, video signal input Y is clamped at sync tip level $V_s$ in clamping circuit 10 and thus exists between white peak level $V_w$ and clamp level $V_s$. Here, the signals of clamp level $V_s$ and of white peak level $V_w$ are generated in reference generator 12 as already described.

FIG. 5 illustrates the data structure stored in the register of the bus decoder shown in FIG. 3. The 32-bit data is formed with the lowest four bits D0–D3 being spare bits, eight-bit first control data D4–D11 for controlling the carrier frequency, eight-bit second control data D12–D19 for controlling the frequency deviation, eight-bit function data D20–D27, and four-bit mode control data D28–D31 indicative of an operation mode.

As shown in FIG. 6, data D0–D31 is latched on the leading edge of a clock pulse train signal when a chip select signal state is high.

Figure 7:
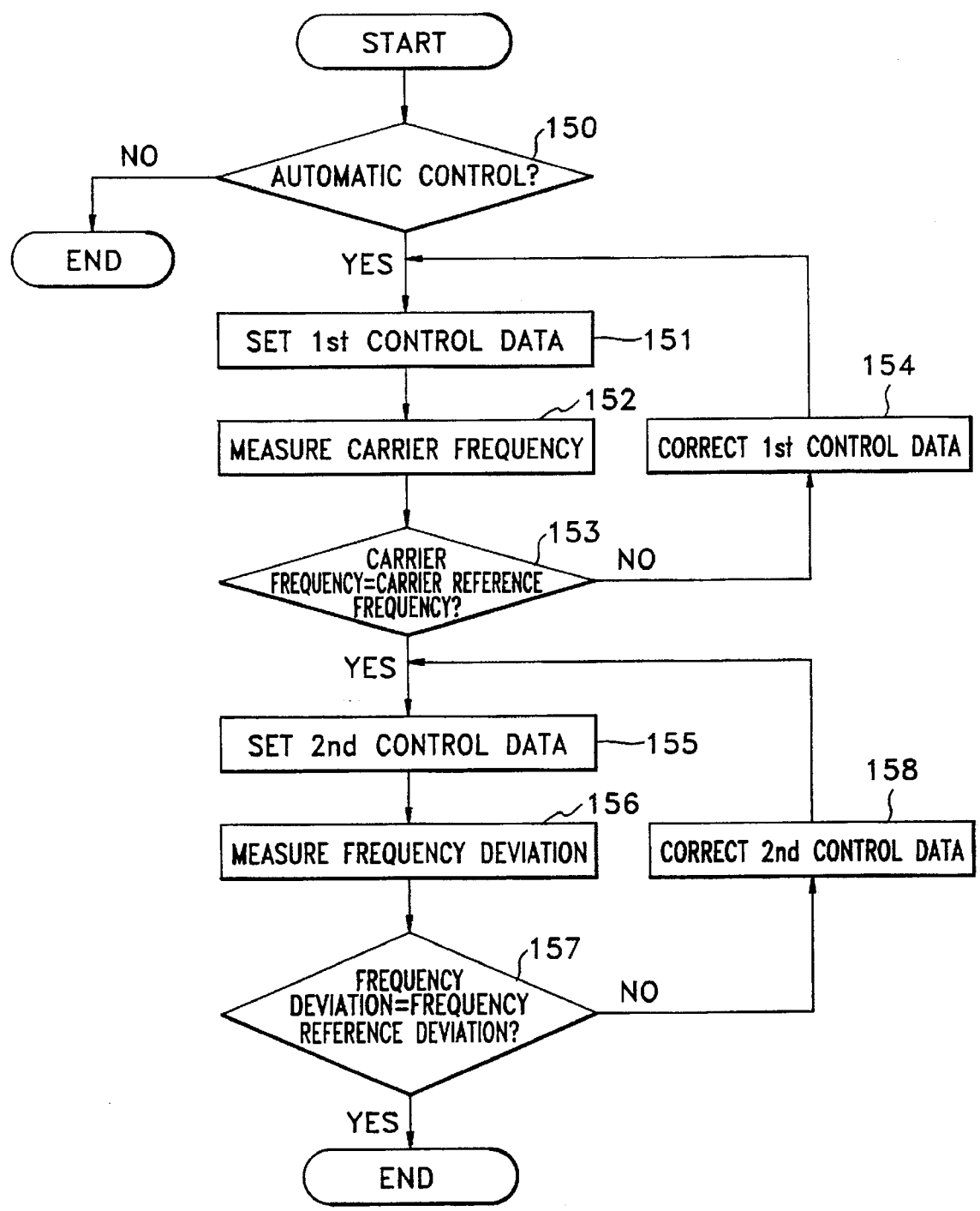
FIG. 7 is a flowchart for the automatic controlling process performed by the microcomputer shown in FIG. 3.

FIG. 7 is a flowchart for illustrating the operation of the microcomputer shown in FIGS. 2 and 3. First, in step 150, microcomputer decides whether to perform automatic controlling. If automatic control is unnecessary, the process ends. If automatic control is to be performed, the first control data for controlling the carrier frequency is set in step 151. In step 152, the input signal selected according to the first control data is frequency-modulated and the frequency of the modulated output is measured. In step 153, the measured frequency is compared with the carrier reference frequency. If the measured frequency is not consistent with the carrier reference frequency, then in step 154 the first control data is corrected and program flow returns to step 151 for setting the first control data. Steps 151, 152, 153 and 154 are repeated until the frequency of the modulated output is consistent with the carrier reference frequency.

If the carrier frequency is consistent with the carrier reference frequency, then in step 155 the second control data for controlling the frequency deviation is set. In step 156, the input signal selected according to the second control data is frequency-modulated and the frequency of the modulated output is measured. In step 157, the measured frequency deviation is compared with the deviation reference frequency. If the measured frequency deviation is not consistent with the deviation reference frequency, then in step 158 the second control data is corrected and program flow returns to step 155 for setting the second control data. The program loop formed by steps 155, 156, 157 and 158 is repeatedly performed until the measured frequency deviation is consistent with the deviation reference frequency. In effect, the microcomputer executes the automatic control program so as to make the carrier frequency and the frequency deviation coincide with the respective reference frequencies.

Figure 8:
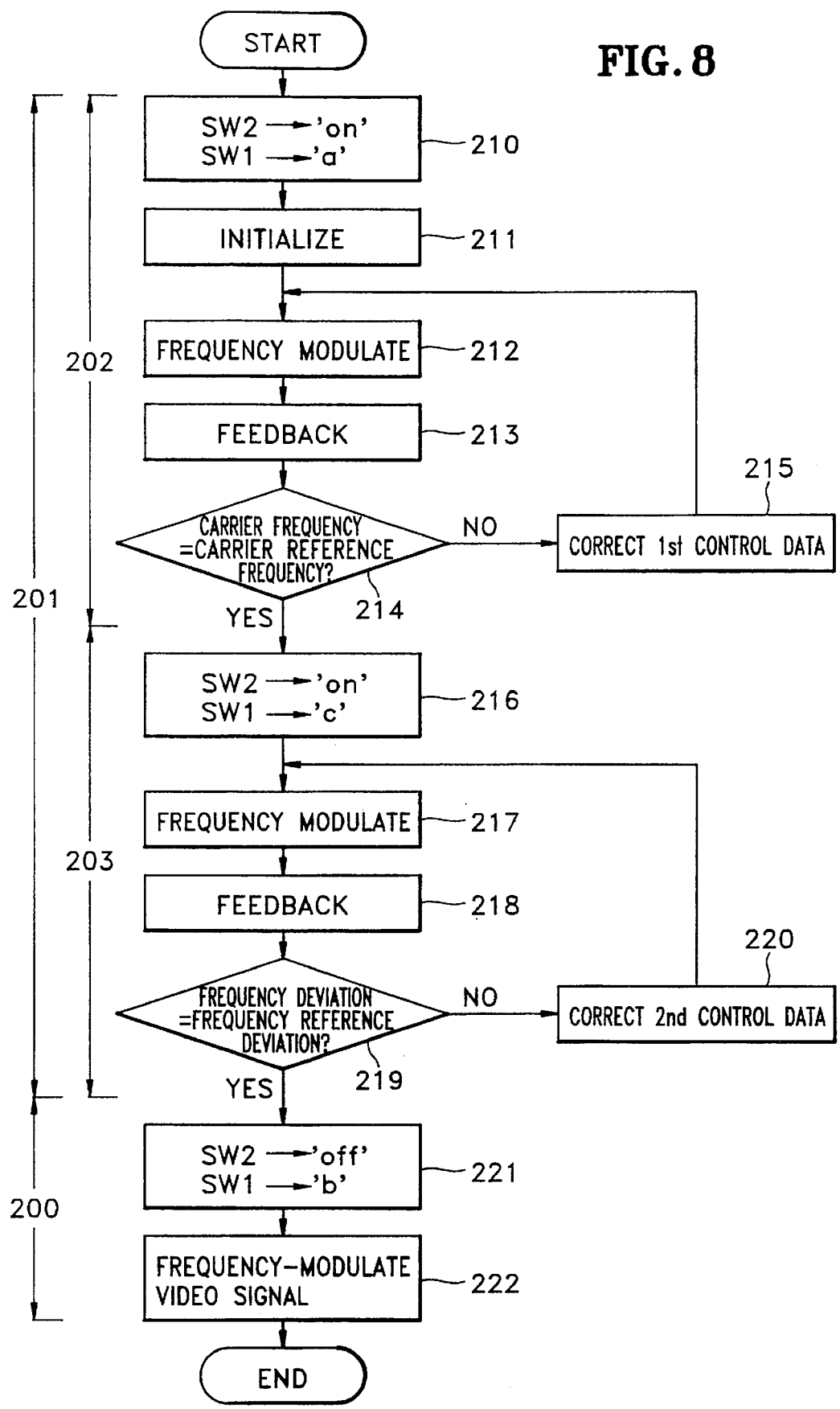
FIG. 8 is a flowchart for the operation of the frequency modulator according to the present invention.

FIG. 8 is a program flowchart further explaining the operation of the present invention. As discussed before, the frequency modulator of the present invention has a control mode designated here as 201 and a normal mode designated here as 200. The control mode 201 is subdivided into a first control mode designated as 202 for automatically controlling the carrier frequency, and a second control mode designated as 203 for automatically controlling the frequency deviation. TABLE 1 shows the operation states of the switches and input signals according to the different modes.

TABLE 1

| mode | | 1st switch | 2nd switch | input signal |
|---|---|---|---|---|
| control mode | 1st control mode | a | ON | sync tip level signal |
| | 2nd control mode | c | ON | white peak level signal |
| normal mode | | b | OFF | video signal |

Referring to FIGS. 3 and 8, when power is turned on, the frequency modulator of the present invention starts to operate under the control of microcomputer 2. If power is on, (for instance, when the record mode is on in a VCR), microcomputer 2 outputs the mode control signal so as to set first control mode 202. First switch SW1 is connected to port a, and second switch SW2 is turned on in step 210. If first switch SW1 is connected to port a, sync tip level signal $V_s$ is input to both the non inverting and inverting inputs of variable gain amplifier 16. The output current of variable gain amplifier 16 is completely an offset current.

During the initialization of step 211, initial control data is sent from microcomputer 2 to first and second digital-to-analog converters 32 and 34 via bus decoder. The initial first control data input to first digital-to-analog converter 32 is selected by taking into consideration the input/output characteristics of the frequency modulation and voltage-to-current conversion stages, and is stored in microcomputer 2. The initial second control data input to second digital-to-analog converter 34 is initially set to represent an expected reference control voltage after predetermining the relationship between the gain of variable gain amplifier 16 and the output voltage of second digital-to-analog converter 34, and is stored in microcomputer 2. The first and second control data input to first and second digital-to-analog converters 32 and 34 are converted into analog signals and output to V/I converter 36 and variable gain amplifier 16.

Variable gain amplifier 16 amplifies sync tip level signal $V_s$ to the gain set by the output of second digital-to-analog converter 34 and converts the amplified signal into a current. In the first control mode, the output value of second digital-to-analog converter 34 for controlling the gain of variable gain amplifier 16 seldom affects the input current of oscillator 20. After the initialization step 211, oscillator 20 frequency-modulates the output current of adder 18 and outputs the modulated signal in step 212.

The output signal modulated in accordance with the initial first control data is shaped to a square wave by Schmitt trigger circuit 38, and is fed back to microcomputer 2 via divider 40 in step 213. Here, divider 40 divides the input frequency by a division number which is appropriately set according to the carrier frequency and outputs the divided frequency to microcomputer. Microcomputer 2 compares the frequency of the modulated output with the carrier reference frequency in step 214. If the frequency of the modulated output is greater than the carrier reference frequency, the first control data is corrected in step 215 to be smaller than the initial value (i.e., decremented). If not, then the first control data is corrected in step 215 to be greater than the initial value (i.e., incremented). While repeating steps 212, 213, 214 and 215, when the frequency of the modulated output is determined to be the same as the carrier reference frequency, the first control data is fixed, and the control mode flow proceeds to the second control mode 203.

In second control mode 203, microcomputer 2 turns on second switch SW2 with the mode control signal and connects first switch SW1 to port c in step 216. When first switch SW1 is connected to port c, white peak level signal $V_w$ is input to the non-inverting input of variable gain amplifier 16, and sync tip level signal $V_s$ is input to the inverting input from reference generator 12. Here, the initial second control data input to second digital-to-analog converter 34 controls the gain of variable gain amplifier 16 so that the modulated output approximates the deviation reference frequency.

Variable gain amplifier 16 amplifies the difference between white peak level signal $V_w$ and sync tip level signal $V_s$ to the gain set by the output of second digital-to-analog converter 34, and converts the amplified result into a current. Oscillator 20 frequency-modulates the output of adder 18 and outputs the modulated output in step 217. The modulated output determined by the initial second control data is shaped to a square wave by Schmitt trigger circuit 38, and is fed back to microcomputer 2 via divider 40 in step 218. Microcomputer 2 compares the frequency of the modulated output with the deviation reference frequency in step 219. If the frequency of the modulated output is greater than the deviation reference frequency, the second control data is corrected in step 220 to be smaller than the initial value. If not, the second control data is corrected in step 220 to be greater than the initial value. While repeating steps 217, 218, 219 and 220, when the frequency of the modulated output is determined to be the same as the deviation reference frequency, the second control data is fixed to set the gain of variable gain amplifier 16.

When the automatic control process is finished, microcomputer 2 outputs a mode control signal so as to select operation in normal mode 200. In normal mode 200, second switch SW2 is turned off to stop the frequency measuring process, and first switch SW1 is connected to port b in step 221. A clamped video signal is frequency-modulated in step 222.

As described above, since the frequency modulator of the present invention can automatically control the carrier frequency and frequency deviation, the automated assembly of products such as VCRs, cam corders and the like can be used to reduce production cost. With automation, the quality of products can be maintained at a consistent level because the production process is not performed manually. Further, since the invention is digitally controlled using a microcomputer employed in a VCR, the control is stable and carried out at a reduced cost.

While the foregoing description includes many specificities, it is intended to be illustrative and not limiting. It will be appreciated by those of skill in the art that many changes, substitutions, and alterations may be made without departing from the spirit and scope of the invention, ad defined by the appended claims.

What is claimed is:

1. A signal frequency modulator which, in a first control mode, controls a carrier frequency using a first reference signal, in a second control mode, controls a frequency deviation with a second reference signal, and in a normal mode, modulates the frequency of a video signal to be modulated, comprising:

a reference signal generator for generating a first reference signal and a second reference signal;

a first switch for selecting one of said first reference signal, said second reference signal and said video signal according to a mode control signal;

a variable gain amplifier for amplifying the selected signal to a predetermined gain and converting the amplified signal into a current signal;

an adder for adding the output of said variable gain amplifier to a predetermined set value;

an oscillator for frequency-modulating the output of said adder;

a frequency detector for shaping and frequency-dividing the output of said oscillator;

a microcomputer for comparing the output of said frequency detector with a predetermined reference frequency and outputting first and second control data and said mode control signal;

a bus decoder for receiving, latching and storing, and transmitting said first and second control data;

carrier frequency setting means for controlling the magnitude of said predetermined set value according to said first control data; and frequency deviation setting means for controlling said predetermined gain according to said second control data.

2. The signal modulator of claim 1, wherein said video signal to be modulated is a video luminance signal, said first reference signal is a sync tip level signal, and said second reference signal is a white peak level signal.

3. The signal frequency modulator of claim 1, further comprising a second switch for connecting or disconnecting said frequency detector and said oscillator according to said mode control signal.

4. The signal frequency modulator of claim 1, wherein said frequency detector comprises a Schmitt trigger circuit for waveform-shaping said oscillator output and a divider for frequency-dividing the output of said Schmitt trigger circuit.

5. The signal frequency modulator of claim 1, wherein said carrier frequency setting means comprises a digital-to-analog converter for converting said first control data into an analog signal, and a voltage to current converter for converting said analog signal into a current signal.

6. The signal frequency modulator of claim 1, wherein said frequency deviation setting means comprises a digital-to-analog converter for converting said second control data into an analog signal.

7. The signal frequency modulator of claim 1, wherein said bus decoder is capable of storing said first and second control data for an indefinite duration which is at least greater than a frame period of said video signal.

8. A frequency modulator for frequency-modulating a video signal to be modulated, comprising:

a reference signal generator for generating a first reference signal and a second reference signal;

a first switch for selecting one of said first reference signal, said second reference signal and said video signal to be modulated according to a mode control signal;

a variable gain amplifier for amplifying the selected signal to a predetermined gain and converting the amplified signal into a current signal;

an adder for generating an added signal by adding said current signal to a predetermined set value;

an oscillator for frequency-modulating said added signal;

a Schmitt trigger circuit for shaping said frequency-modulated added signal;

a divider for frequency-dividing the shaped signal;

a microcomputer for comparing the output of said divider with a predetermined reference frequency and generating first and second control data and said mode control signal;

a bus decoder for receiving, latching and storing, and transmitting said first and second control data, and said mode control signal;

a first digital-to-analog converter for converting said first control data into a first analog signal;

a second digital-to-analog converter for converting said second control data into a second analog signal for controlling said predetermined gain according to said second control data; and a V/I converter for converting said first analog signal into a current signal for controlling the magnitude of said predetermined set value according to said first control data.

9. The frequency modulator of claim 8, wherein said video signal to be modulated is a clamped video signal, said first reference signal is a sync tip signal, and said second reference signal is a white peak signal.

10. The frequency modulator of claim 7, wherein said bus decoder is capable of storing said first and second control data for an indefinite duration which is at least greater than a frame period of said video signal.

11. A method for adjusting a frequency modulator for modulating a video signal to be modulated, the method comprising the steps of:

supplying a first reference signal to an amplifier;

converting the amplified first reference signal to a first current signal;

adding said first current signal to a predetermined set signal;

frequency modulating said first added signal;

supplying said first frequency-modulated signal to a microcomputer;

generating a first control data signal corresponding to the difference between the carrier frequency of said first frequency-modulated signal and a carrier reference frequency;

latching and storing said first control data signal;

adjusting said predetermined set signal in accordance with said first control data signal;

supplying a second reference signal to said amplifier;

converting the amplified second reference signal to a second current signal;

adding said second current signal to said predetermined set signal;

frequency modulating said second added signal;

supplying said second frequency-modulated signal to the microcomputer;

generating a second control data signal corresponding to the difference between the frequency deviation of said second frequency-modulated signal and a reference frequency deviation;

latching and storing said second control data signal; and adjusting the gain of said amplifier in accordance with said second control data signal.

12. The method of claim 11, wherein said signal to be modulated is a video signal, said first reference signal is a sync tip level signal, and said second reference signal is a white peak signal.

13. The method of claim 12, wherein said step of adjusting said predetermined set signal comprises the steps of:

converting said first control data into a first analog control signal;

converting said first analog control signal to a first current control signal; and supplying said first current control signal as said predetermined set signal.

14. method of claim 13, wherein said step of adjusting the gain of said amplifier comprises the steps of:

converting said second control data signal to a second analog control signal; and supplying said second analog control signal to said amplifier to adjust said gain.

15. The method of claim 9, wherein said steps of latching and storing said first and second control data signals are both performed so as to store said first and second control data signals for an indefinite duration which is at least greater than a frame period of said signal to be modulated.

* * * * *